United States Patent
Hori

(12) 
(10) Patent No.: US 6,681,463 B2
(45) Date of Patent: Jan. 27, 2004

(54) MANUFACTURING METHOD OF PIEZOELECTRIC COMPONENTS

(75) Inventor: Nobuyuki Hori, Ishikawa-ken (JP)

(73) Assignee: Murata Manufacturing Co., Ltd., Kyoto (JP)

(*) Notice: Subject to any disclaimer, the term of this patent is extended or adjusted under 35 U.S.C. 154(b) by 89 days.

(21) Appl. No.: 10/132,282

(22) Filed: Apr. 26, 2002

(65) Prior Publication Data

US 2002/0175601 A1 Nov. 28, 2002

(30) Foreign Application Priority Data

May 23, 2001 (JP) .................................... 2001-154213

(51) Int. Cl.⁷ ............................................. H04R 17/00
(52) U.S. Cl. ......................... 29/25.35; 29/846; 29/831
(58) Field of Search ............................ 29/25.35, 846, 29/831; 310/320, 365; 427/100, 96, 98, 99, 282, 124, 79

(56) References Cited

U.S. PATENT DOCUMENTS

| | | | | |
|---|---|---|---|---|
| 3,596,212 A | * | 7/1971 | Werner | 333/72 |
| 5,065,066 A | * | 11/1991 | Nakatani et al. | 310/320 |
| 5,446,335 A | * | 8/1995 | Hino | 310/359 |
| 5,808,397 A | * | 9/1998 | Kotani | 310/320 |
| 5,923,480 A | * | 7/1999 | Labeye | 359/814 |

FOREIGN PATENT DOCUMENTS

JP    11-297471    10/1999

* cited by examiner

*Primary Examiner*—A. Dexter Tugbang
*Assistant Examiner*—Tai V Nguyen
(74) *Attorney, Agent, or Firm*—Keating & Bennett, LLP

(57) ABSTRACT

A method for manufacturing piezoelectric components involves using a plurality of divided hard masks to form a highly accurate electrode pattern without degradation of electrical characteristics while increasing mask strength. The method is for forming vibration electrodes, terminal electrodes, and lead electrodes for connecting the vibration and terminal electrodes on a piezoelectric substrate and includes the step of preparing a first hard mask having openings corresponding to the vibration electrode and lead electrodes and a second hard mask having openings corresponding to the terminal and lead electrodes. The first and second hard masks are arranged such that the openings of the first and second hard masks are partially overlapped, and the overlapped portion is located at a position that is spaced from the vibration electrode by at least about three times the thickness of the piezoelectric substrate.

20 Claims, 6 Drawing Sheets

TOP PLAN VIEW

SECTIONAL VIEW AT LINE A-A

MANUFACTURING METHOD OF PIEZOELECTRIC COMPONENTS

BACKGROUND OF THE INVENTION

1. Field of the Invention

The present invention relates to a method for manufacturing piezoelectric components in which electrodes are formed on a surface of a piezoelectric substrate by a thin-film deposition technique such as a sputtering and a vacuum evaporation technique.

2. Description of the Related Art

When manufacturing piezoelectric components such as a dual-mode filter utilizing a thickness-longitudinal-vibration mode, which has complex-shaped electrodes, such as vibration electrodes, input-output-terminal electrodes, lead electrodes, and relay-capacitance electrodes, the electrodes are formed on a surface of a piezoelectric substrate by first applying an electrode material on the entire surface of the substrate by sputtering or vacuum evaporation, and then etching the electrode material via photolithography to form the electrodes. However, a large number of steps are required to complete the etching using photolithography, and thus, the manufacturing costs increase.

A method for applying an electrode material on the substrate using a hard mask requires fewer steps than the etching process and is also less expensive. However, when forming an electrode with a complex shape, the shape of the opening in the hard mask also is complex which reduces the strength of the hard mask. Therefore, the hard mask deforms due to the heat produced during adhesion of the electrode material such that a space is formed between the hard mask and the substrate which allows the electrode material to flow into the space, and thus the accuracy of the electrode pattern is greatly reduced.

As a solution to this problem, the use of divided hard masks, in which an electrode shape is divided into two or more patterns, has been proposed in Japanese Unexamined Patent Application Publication No. 11-297471.

However, for the piezoelectric components, the electrode-forming method using the divided hard masks has not been utilized for the following reasons.

At the divided portion of the electrode pattern, the electrode materials are built up for preventing wire breaking of the electrode. However, in the case of the piezoelectric components, electrical characteristics of the piezoelectric component deteriorate due to the position of the built up portion on the substrate, i.e., the electrode portion with a thickness larger than others.

SUMMARY OF THE INVENTION

In order to overcome the above-described problems, preferred embodiments of the present invention provide a method for manufacturing piezoelectric components utilizing a plurality of divided hard masks to form an electrode pattern with high accuracies while improving the strength of the hard mask and not degrading electric characteristics of the piezoelectric component.

According to a preferred embodiment of the present invention, a method for manufacturing piezoelectric components, in which a vibration electrode, terminal electrodes, and lead electrodes for connecting the vibration and terminal electrodes are formed on a piezoelectric substrate by a thin-film deposition technique, the method including the steps of preparing a first hard mask having openings corresponding to the vibration electrode and lead electrodes, preparing a second hard mask having openings corresponding to at least the terminal electrodes, continuously forming the vibration electrode and lead electrodes by the thin-film deposition technique while arranging the first hard mask on the piezoelectric substrate, and forming at least the terminal electrodes by the thin-film deposition technique while arranging the second hard mask on the piezoelectric substrate, wherein the first and second hard masks are arranged such that the openings of the first and second hard masks are partially overlapped, and wherein the overlapped portion of the first and second hard masks is located at a position on one of the lead electrode and the terminal electrode, the position being spaced from the vibration electrode by at least about three times the thickness of the piezoelectric substrate.

First, the first hard mask having openings corresponding to the vibration electrode and the lead electrodes and the second hard mask having openings corresponding at least to the terminal electrodes are prepared. The openings formed on the first hard mask extend continuously from the vibration electrode toward the entire or a portion of the lead electrodes. The openings formed on the second hard mask correspond at least to the terminal electrodes and may continuously extend along a portion of the lead electrodes. The openings formed on the divided hard masks have a simple or small area configuration to prevent a reduction in the strength of the hard mask.

Next, the first hard mask is arranged on the piezoelectric substrate, on which no electrode is formed, so as to continuously form the vibration electrode and the lead electrodes thereon by the thin-film depositing technique, such as a sputtering and vacuum evaporation technique. During the thin-film depositing, heat is applied to the hard mask, however, since the hard mask has increased strength as mentioned above, a highly accurate electrode pattern is formed.

Then, the second hard mask is arranged on the piezoelectric substrate, on which the vibration electrode and the lead electrodes are formed, so as to form at least the terminal electrodes by the thin-film depositing technique in the same manner. At this time, to prevent wire breakage, the lead electrodes formed by the first hard mask are partially overlapped on the terminal electrodes or a portion of the lead electrodes formed by the second hard mask so as to increase the thickness of the electrodes. Since the overlapped portion, however, is located at a position spaced from the vibration electrode preferably by about three times or more than the thickness of the piezoelectric substrate, the piezoelectric vibration produced by the vibration electrode is not adversely affected by the overlapped portion, thus, preventing characteristic degradation caused by unnecessary vibration or reflection waves.

Adhesion of an electrode material to a portion of a piezoelectric component which does not require it directly produces deterioration of electrical characteristics, such that accuracy in electrode configuration is demanded. When using the divided hard masks, the second or later-used hard mask is spaced from the substrate due to the thickness of the previously applied electrode material so as to produce a clearance between the hard mask and the substrate. When the electrode material extends into the clearance, blurring or deformation in shape of a finished electrode is produced which causes characteristic degradation.

Preferably, a contact surface between the surface of the piezoelectric substrate and the second hard mask includes a concave portion formed to accommodate the vibration and lead electrodes formed using the first hard mask.

That is, when the second hard mask is arranged on the piezoelectric substrate, the vibration and lead electrodes are located within the concave portion formed on the second hard mask to prevent the second hard mask from being spaced from the piezoelectric substrate. Accordingly, when forming the terminal electrodes and lead electrodes, the blurring or deformation in shape of the electrodes is prevented from occurring, and thus characteristic degradation is prevented.

In addition, the order of forming electrodes on the piezoelectric substrate is not limited to the above-described procedure. Alternatively, the terminal electrodes and the lead electrodes may be formed using the second hard mask before the vibration electrodes are formed using the first hard mask.

Then, preferably, a contact surface between the surface of the piezoelectric substrate and the first hard mask is provided with a concave portion formed to accommodate the terminal and lead electrodes formed using the second hard mask.

When the lead electrode includes a curved portion at an intermediate portion thereof, the divided portion is the curved portion of the lead electrode, such that the opening shape is simplified. That is, preferably, the openings of the first hard mask extend from the vibration electrode to a position corresponding to the curved portion of the lead electrode, and the openings of the second hard mask extend from the terminal electrode to a position corresponding to the curved portion of the lead electrode.

When the lead electrode has a straight shape, preferably, the openings of the first hard mask extend from the vibration electrode to positions corresponding to the connection portions of the lead electrodes to the terminal electrodes, and the openings of the second hard mask correspond only to the terminal electrodes. In this case, the terminal end of the lead electrode is overlapped on the terminal electrode.

The divided portion is preferably located on the lead electrode when using divided hard masks for the following reasons. When the divided portion is located on the terminal electrode, an opening extending from the vibration electrode to a portion of the terminal electrode via the lead electrode on the piezoelectric substrate would be required, such that the opening configuration of the first hard mask is complicated, resulting in a substantial reduction in the strength of the first hard mask. Similarly, when the divided portion is located on the vibration electrode, an opening extending from the terminal electrode to a portion of the vibration electrode via the lead electrode on the piezoelectric substrate would be required, such that the opening configuration of the second hard mask is complicated, resulting in a substantial reduction in the of the second hard mask. Such a problem becomes noticeable especially when a curved portion is provided on the lead electrode. Furthermore, when the divided portion is located on the vibration electrode, the vibration electrode is partially changed in thickness which adversely influences the vibration characteristics. Therefore, it is preferable that the divided portion be located on the lead electrode.

In addition, the width of the lead electrode is small, approximately 0.2 mm, for example. However, since accuracies in the size of the openings of the hard mask and in the positioning of the hard mask are greatly improved in preferred embodiments of the present invention, there are no problems with the accuracy of the lead electrodes.

As described above, according to preferred embodiments of the present invention, since an electrode pattern is formed on the piezoelectric substrate using a plurality of separate hard masks, the configuration of openings formed on each hard mask is greatly simplified so as to form a high-accuracy electrode pattern by preventing the reduction in strength of the hard mask.

Also, after forming the vibration electrodes and lead electrodes (or the terminal electrodes and lead electrodes) on the piezoelectric substrate using the first (or second) hard mask, the terminal electrodes and lead electrodes (or the vibration electrodes and lead electrodes) are continuously formed on the piezoelectric substrate using the second (or first) hard mask, while the terminal electrode or a portion of the lead electrode formed by the second (or first) hard mask is overlapped on the lead electrode formed by the first (or second) hard mask, such that wire breakage does not occur in a lead electrode portion so as to connect the electrodes securely.

Furthermore, because the overlapped portion of the electrodes is located at a position that is spaced from the vibration electrode by about three times or more than the thickness of the piezoelectric substrate, the piezoelectric vibration caused by the vibration electrodes is not adversely affected by the overlapped portion, thereby preventing characteristic degradation due to unnecessary vibration or reflection waves.

Other features, elements, characteristics and advantages of the present invention will become more apparent from the following description of preferred embodiments thereof with reference to the attached drawings.

DETAILED DESCRIPTION OF PREFERRED EMBODIMENTS

Figure 1:
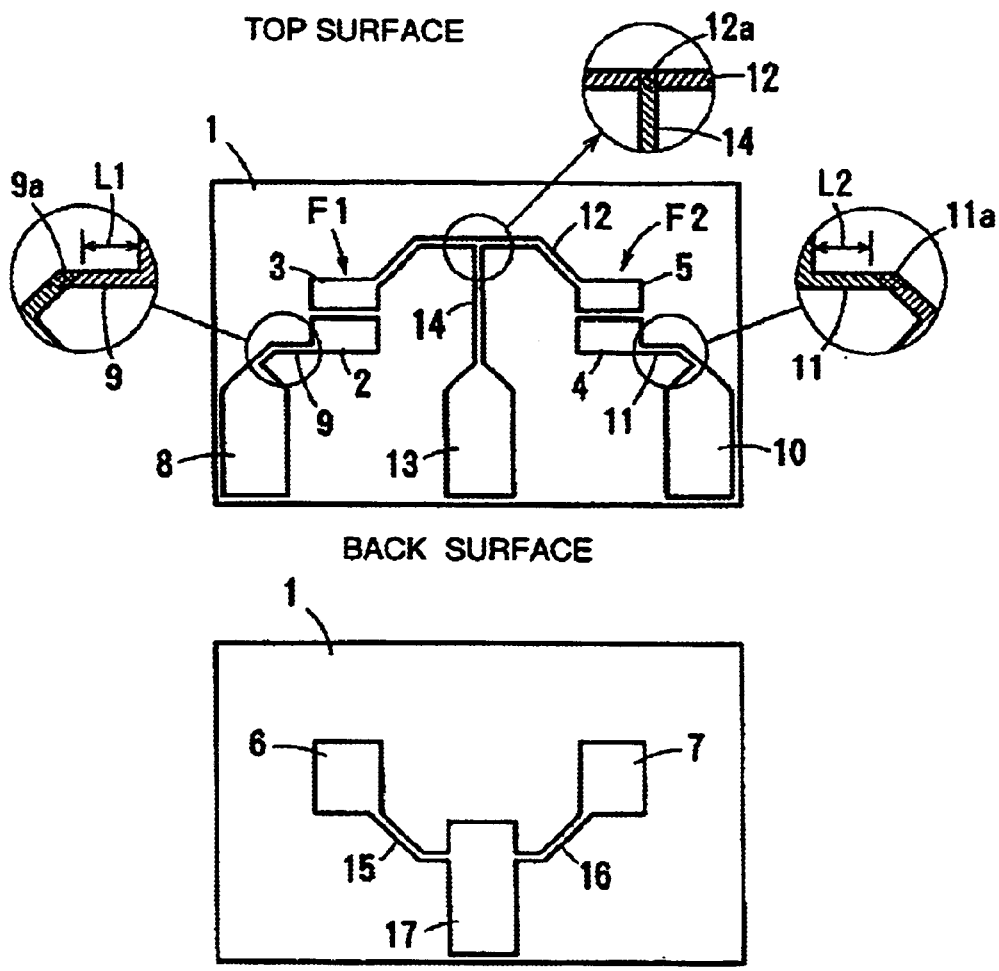
FIG. 1 is a drawing of a piezoelectric component example manufactured by a method according to a preferred embodiment of the present invention, the drawing including a top surface view and back surface view.

FIG. 1 shows an example of piezoelectric components manufactured by a manufacturing method according to a preferred embodiment of the present invention, wherein an energy-trap type piezoelectric filter utilizing a thickness-longitudinal-vibration mode is exemplified. However, the present invention is not limited thereto.

The piezoelectric filter preferably includes a substantially rectangular piezoelectric substrate 1 made of piezoelectric ceramics or piezoelectric monocrystal or other suitable material, in which the top major surface of the substrate is provided with two pairs of divided electrodes (vibration electrodes) 2, 3, 4, and 5, both pairs being arranged thereon at a desired distance from each other, while the back major surface is provided with common electrodes (vibration electrodes) 6 and 7 provided thereon to correspond to the pairs of divided electrodes 2, 3, 4, and 5, respectively. One dual-mode filter element F1 is defined by these vibration electrodes 2, 3, and 6, while another dual-mode filter element F2 is defined by the vibration electrodes 4, 5, and 7.

On the top major surface of the piezoelectric substrate 1, the divided electrode 2 is connected via a lead electrode 9 to an input terminal electrode 8 provided at one corner of the piezoelectric substrate 1, while the divided electrode 4 is connected via a lead electrode 11 to an output terminal electrode 10 provided at another corner of the piezoelectric substrate 1. Both lead electrodes 9 and 11 include curved portions 9a and 11a provided at intermediate portions thereof. Furthermore, the divided electrodes 3 and 5 are connected together via a lead electrode 12. Also, the central portion of the piezoelectric substrate 1 is provided with a relay-capacitance electrode 13 provided thereon, which is connected to the central portion of the lead electrode 12 via a lead electrode 14.

On the back major surface of the piezoelectric substrate 1, the common electrodes 6 and 7 are connected to a terminal electrode 17 for grounding and also defining a capacitance electrode via respective lead electrodes 15 and 16. The grounding terminal electrode 17 opposes the capacitance electrode 13 with the piezoelectric substrate 1 interposed therebetween so as to form a relay capacitance C.

The above-mentioned lead electrodes 9, 11, 12, 14, 15, and 16 preferably have a width that is less than the other electrodes.

Figure 2:
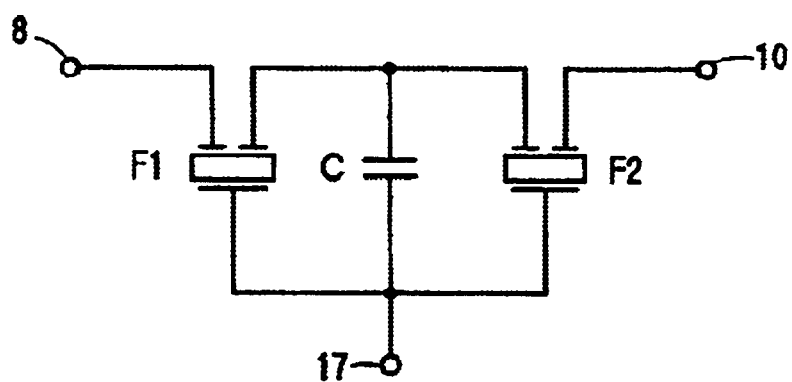
FIG. 2 is a circuit diagram of the piezoelectric component shown in FIG. 1.

FIG. 2 is a circuit diagram of the piezoelectric filter.

Figure 3:
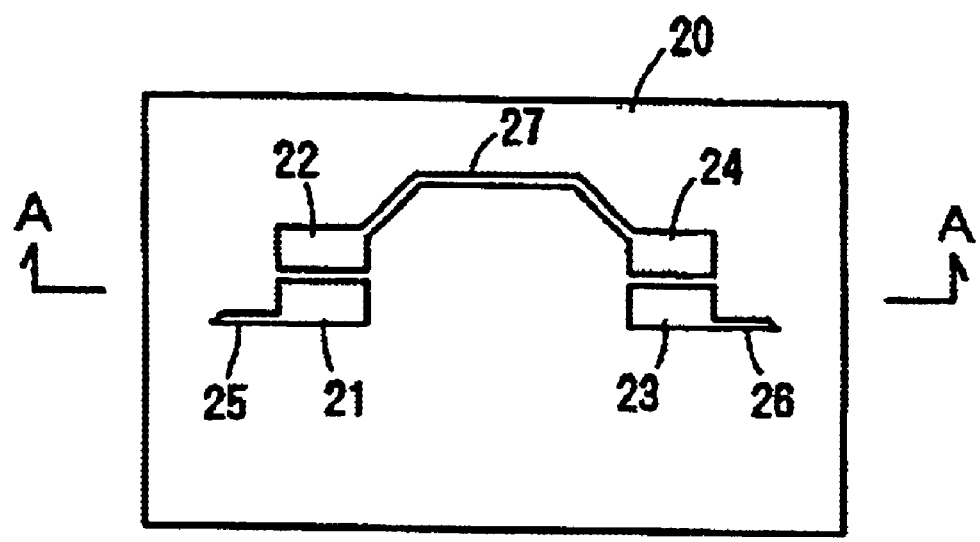
FIG. 3 includes a plan view and sectional view at the line of B—B of a first hard mask for forming topside electrodes of the piezoelectric component shown in FIG. 1.
Figure 3:
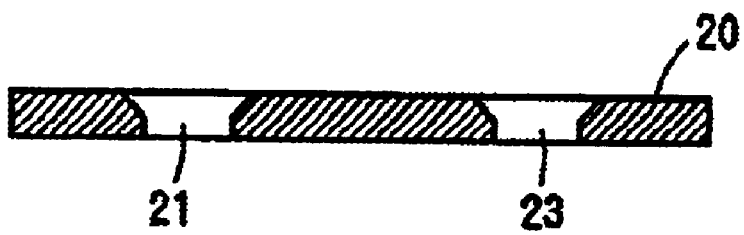
Figure 4:
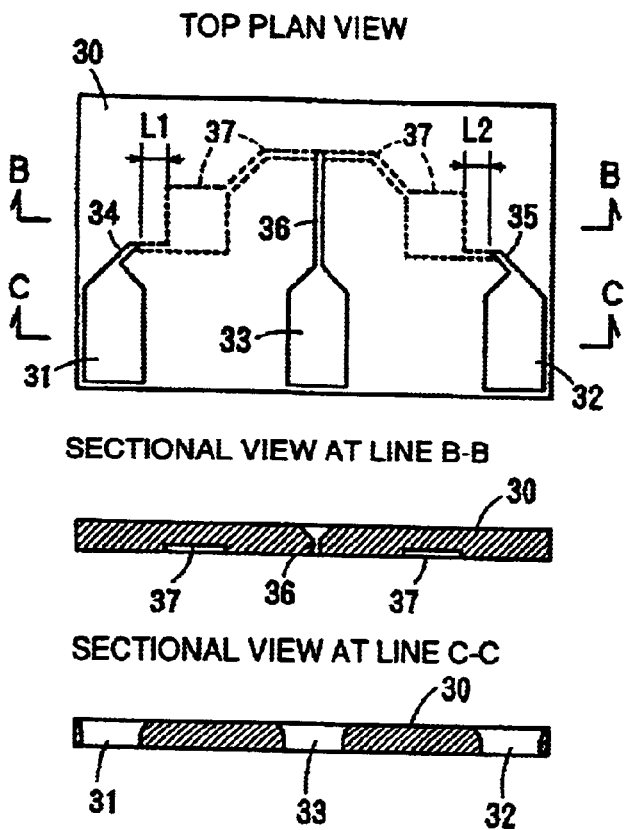
FIG. 4 includes a plan view, sectional view at the line of B—B, and sectional view at the line of C—C of a second hard mask for forming topside electrodes of the piezoelectric component shown in FIG. 1.

FIG. 3 shows a first hard mask 20 used to form the electrodes on the top major surface of the piezoelectric filter, and FIG. 4 shows a second hard mask 30.

Figure 5:
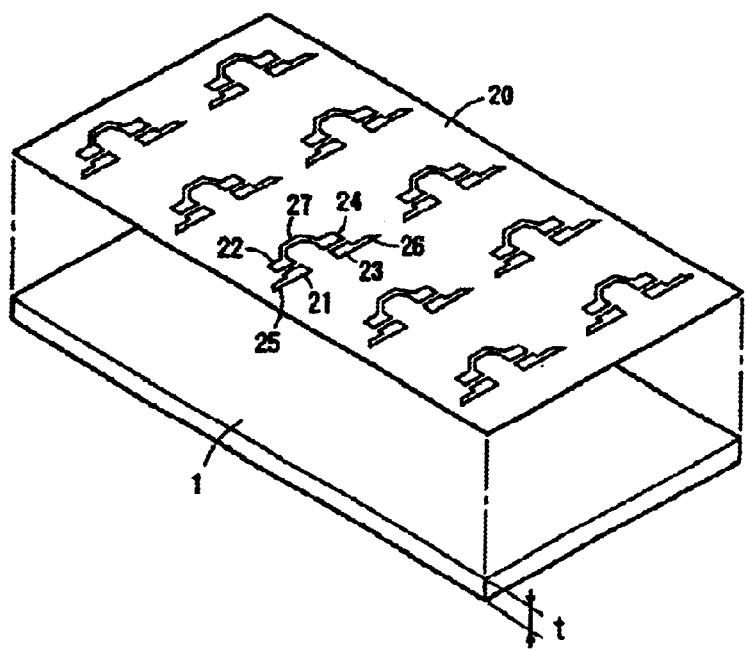
FIG. 5 is a perspective view of an actual first hard mask and piezoelectric substrate (motherboard).
Figure 6:
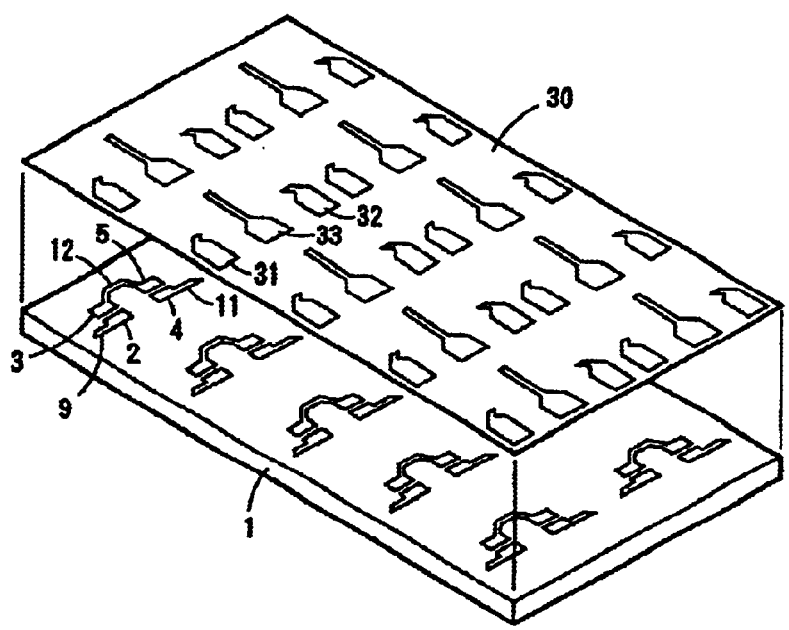
FIG. 6 is a perspective view of an actual second hard mask and piezoelectric substrate (motherboard).

In addition, the hard masks shown in FIGS. 3 and 4 are for one piezoelectric filter, however, each of the actual hard masks 20 and 30, as shown in FIGS. 5 and 6, include a plurality of openings so as to simultaneously form a plurality of electrodes on a motherboard.

The first hard mask 20 is preferably made of a heat-resistant metallic or resin plate and includes openings 21, 22, 23, and 24 for forming the divided electrodes 2, 3, 4, and 5, openings 25 and 26 for forming a portion of the lead electrode 9 and a portion of the lead electrode 11, and an opening 27 for forming the lead electrode 12. The openings 25 and 26 extend from positions corresponding to the divided electrodes 2 and 4 to positions corresponding to the curved parts 9a and 11a of the lead electrodes 9 and 11.

In addition, at edges of these openings 21 to 27, tapered extended portions are provided to allow metallic particles to pass evenly through the openings.

Also, the second hard mask 30, in the same manner as in the first hard mask 20, is preferably made of a heat-resistant metallic or resin plate, and includes openings 31, 32, and 33 for forming the terminal electrodes 8 and 10 and the capacitance electrode 13 and small-width openings 34, 35, and 36 for forming lead electrodes extending from the openings 31, 32, and 33. The openings 34 and 35 extend from positions corresponding to the terminal electrodes 8 and 10 to positions corresponding to the curved portions 9a and 11a of the lead electrodes 9 and 11. The back surface of the hard mask 30, i.e., a contact surface to the piezoelectric substrate 1, is provided with a concave portion 37 provided therein to accommodate the divided electrodes 2, 3, 4, and 5, portions of the lead electrodes 9 and 10, and the lead electrode 12. The depth of the concave portion 37 is at least equal to the thickness of the electrodes formed by using the first hard mask 20, and the shape of the concave portion 37 corresponds to the above-mentioned electrodes.

In addition, at edges of these openings 31 to 36, tapered extended portions are also provided.

In the second hard mask 30, respective distances L1 and L2 between edges of the openings 34 and 35 corresponding to portions of the lead electrodes 9 and 10 and the divided electrodes 2, 3, 4, and 5 formed by using the first hard mask 20 are at least about three times the thickness t of the piezoelectric substrate 1, such that the following relationships are satisfied:

$L1 \geq 3t$ $L2 \geq 3t$

A method for forming electrodes on the top surface of the piezoelectric substrate 1 using the hard masks 20 and 30 will be described with reference to FIGS. 5 and 6.

First, as shown in FIG. 5, the first hard mask 20 is provided on the surface of the piezoelectric substrate 1, on which no electrodes are formed, so as to apply an electrode material (silver, for example) on the piezoelectric substrate 1 by using an evaporation or sputtering technique. Thereby, the electrode material passing through the openings 21 to 27 adheres on the piezoelectric substrate 1 so as to form the vibration electrodes 2 to 5 and the lead electrodes 9, 11, and 12, as shown in FIG. 6.

Next, the second hard mask 30 is provided on this piezoelectric substrate 1 so as to apply electrode material on the piezoelectric substrate 1 by using the evaporation or sputtering technique in the same manner. At this time, the electrodes formed by the first evaporation or sputtering technique are accommodated within the concave portion 37 provided on the back surface of the second hard mask 30 so as to prevent the second hard mask 30 from being spaced from the piezoelectric substrate 1. By the second evaporation or sputtering, the terminal electrodes 8 and 10, the capacitance electrode 13, and the balance of the lead electrodes 9 and 11 are formed. The electrodes formed by the second evaporation or sputtering are incorporated with the electrodes formed by the first evaporation or sputtering so as to form the piezoelectric component with the electrode configuration as shown in FIG. 1.

In addition, although the specific description is omitted, the electrodes 6, 7, and 15 to 17 formed on the back surface of the piezoelectric substrate 1 may be formed by using the divided hard masks in the same manner as described above or the electrodes may be simultaneously formed by a single hard mask.

During the second evaporation or sputtering, the lead electrodes 9 and 11 formed using the second hard mask are partially overlapped on the lead electrodes 9 and 11 formed using the first hard mask, and the electrode material in the overlapped portions 9a and 11a has a thickness that is greater than that in other portions (see FIG. 1). The overlapped portions 9a and 11a are located at the curved portions of the lead electrodes 9 and 11. When the overlapped portions 9a and 11a exist within the vibration range, thickness-longitudinal vibration is obstructed, thereby degrading characteristics. However, since the respective distances L1 and L2 between edges of the openings 34 and 35 of the second hard mask 30 corresponding to portions of the lead electrodes 9 and 10 and the divided electrodes 2, 3, 4, and 5 are at least three times the thickness t of the piezoelectric substrate 1, the overlapped portions (curved portions) 9a and 11a are also spaced from the divided electrodes 2, 3, 4, and 5 by at least three times the thickness t of the piezoelectric substrate 1. Therefore, as shown in FIGS. 7 and 8, electrical characteristics are thereby not adversely affected as a piezoelectric filter.

In addition, an overlapped portion 12a is also produced between the lead electrodes 12 and 14 which does not adversely effect the electrical characteristics of a piezoelectric filter because the overlapped portion 12a is also spaced from the divided electrodes 2, 3, 4, and 5 by at least about three times the thickness t of the piezoelectric substrate 1.

Figure 7:
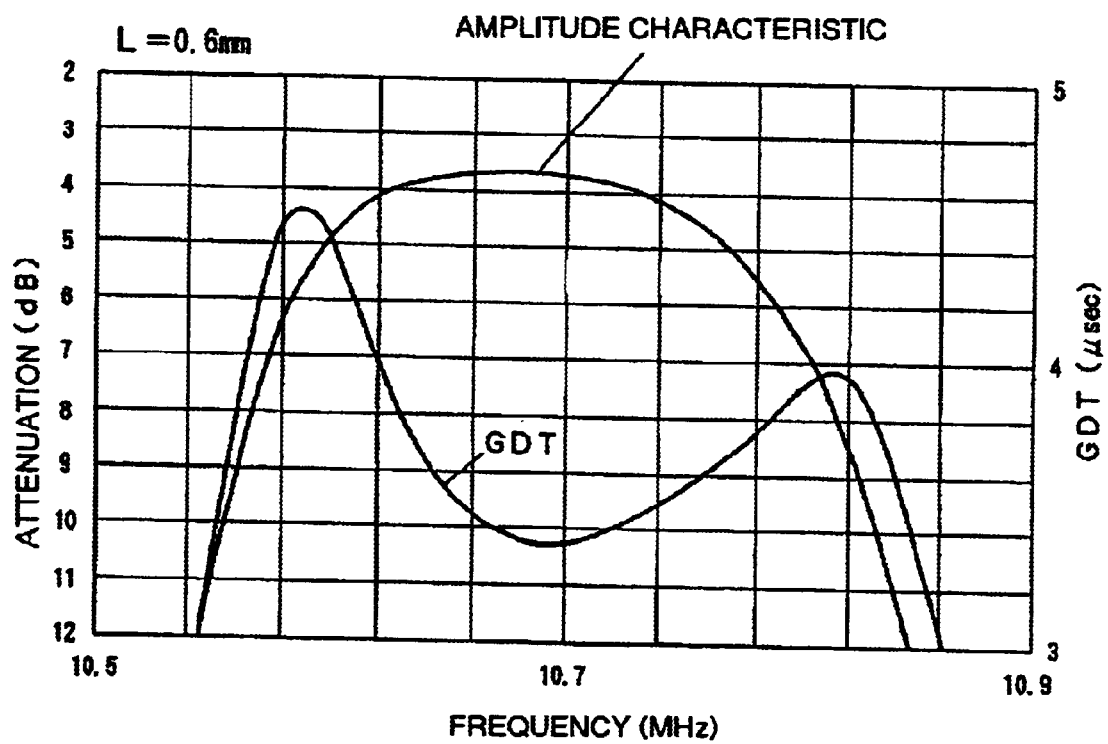
FIG. 7 is a filter-waveform diagram of a piezoelectric component, in which an overlapped portion of lead electrodes is located at a position that is spaced about 0.6 mm from a vibration electrode.
Figure 8:
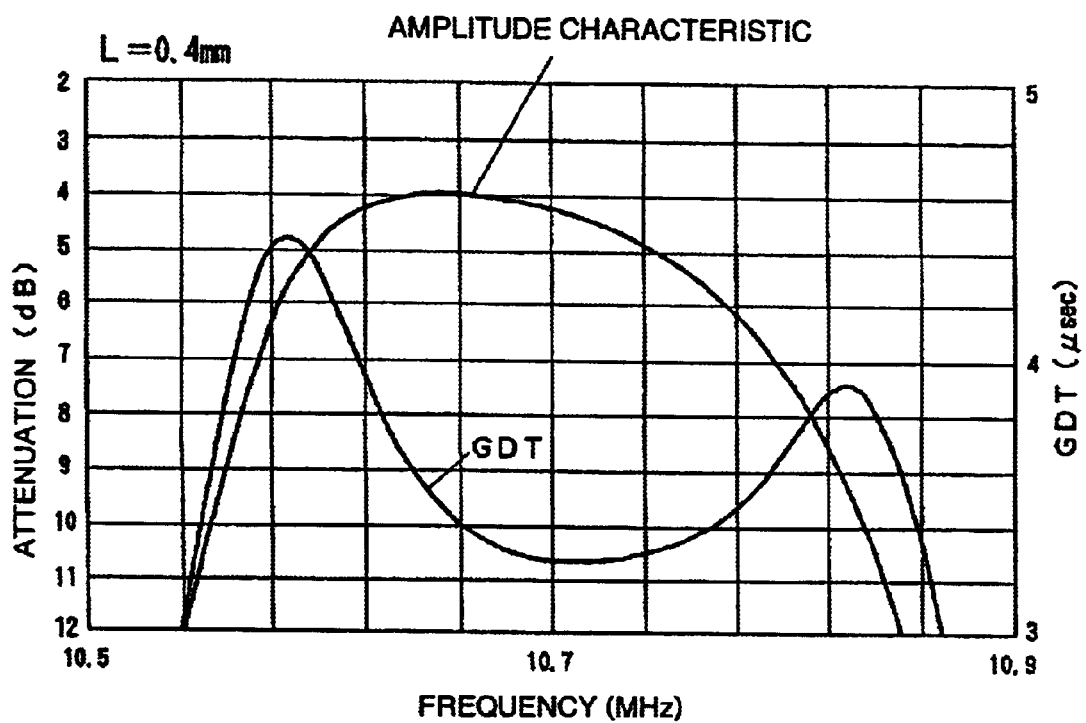
FIG. 8 is a filter-waveform diagram of a piezoelectric component, in which the overlapped portion of the lead electrodes is located at a position that is spaced about 0.4 mm from the vibration electrode.

FIG. 7 shows the characteristics when L=0.6 mm, in which L is the distance between the divided electrodes 2, 3, 4, and 5 and the overlapped portions 9a, 11a, and 12a, while FIG. 8 shows those when L=0.4 mm, wherein the piezoelectric substrate thickness t=200 $\mu$m (10.7 MHz), such that L$\geq$3t in the former and L<3t in the latter.

As shown in FIGS. 7 and 8, the loss at 10.7 MHz is 3.6 dB in the former and 4.0 dB in the latter which is an increase of approximately 25%. Also, it is understood that the filter waveform in FIG. 7 is substantially laterally symmetrical while in FIG. 8, the filter waveform is laterally asymmetrical. Also, the bandwidth at 20 dB is 450 kHz in the former while it is 471 kHz in the latter such that the selectivity is degraded by approximately 5%.

In addition, when electrical characteristics are measured for L=0.8 mm in the same manner, the same results as for L=0.6 mm are obtained.

As is understood from the results mentioned above, when L$\geq$3t, greatly improved electrical characteristics are obtained.

Figure 9:
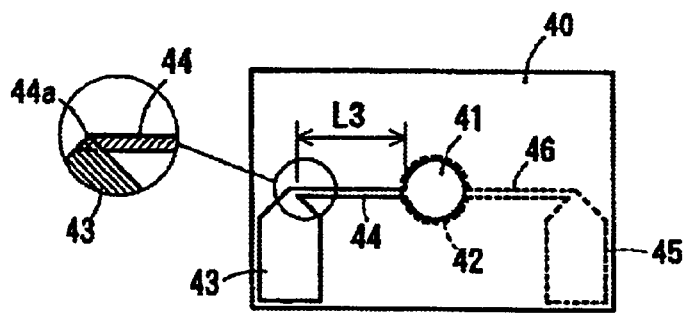
FIG. 9 is a surface view of another piezoelectric component manufactured by the method according to another preferred embodiment of the present invention.

FIG. 9 shows another piezoelectric component manufactured by the method according to another preferred embodiment of the present invention. The piezoelectric component is a ceramic discriminator utilizing thickness-longitudinal vibration.

The discriminator preferably includes a substantially rectangular piezoelectric substrate 40 made of piezoelectric ceramics or piezoelectric monocrystal or other suitable material, in which the top major surface of the substrate is provided with a substantially circular vibration electrode 41 provided thereon, while the back major surface is provided with a vibration electrode 42 arranged to oppose the vibration electrode 41. On the top major surface of the substrate 40, the vibration electrode 41 is connected to an input terminal electrode 43 provided at one end of the piezoelectric substrate 40 via a thin lead electrode 44. On the back major surface of the substrate 40, the vibration electrode 42 is connected to an input terminal electrode 45 provided at the other end of the piezoelectric substrate 40 via a thin lead electrode 46. Both the lead electrodes 44 and 46 have a substantially straight configuration.

A connection portion between the terminal electrode 43 and the lead electrode 44 is provided with an overlapped portion 44a of the electrodes provided thereon, while similarly, a connection portion between the terminal electrode 45 and the lead electrode 46 is also provided with an overlapped portion (not shown) of the electrodes provided thereon. The respective distances L3 between these overlapped portions 44a and the vibration electrodes 41 and 42 are at least three times the thickness t of the piezoelectric substrate 40.

Figure 10:
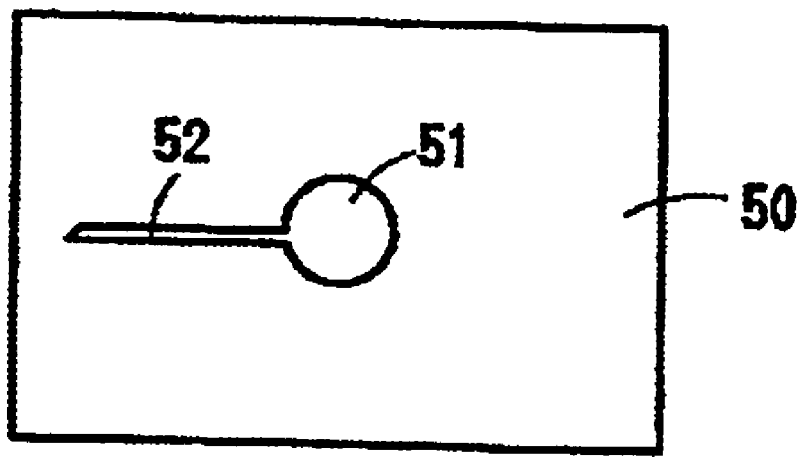
FIG. 10 is a plan view of a first hard mask for forming topside electrodes of the piezoelectric component shown in FIG. 9.
Figure 11:
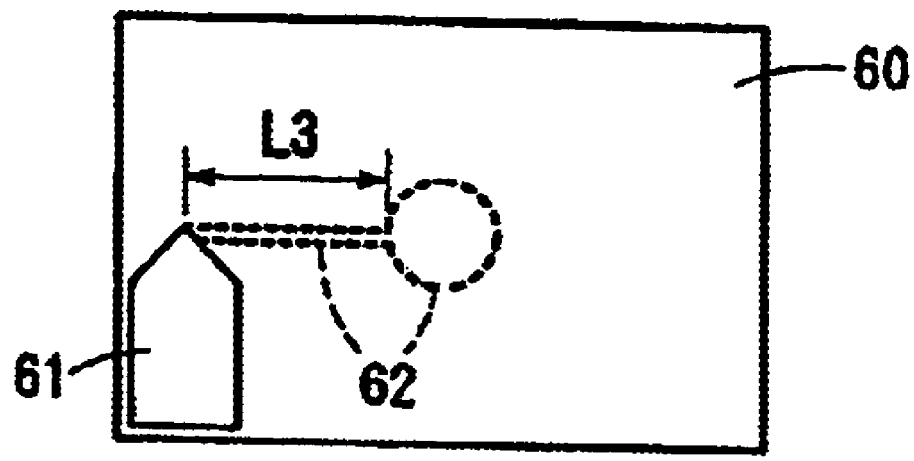
FIG. 11 is a plan view of a second hard mask for forming topside electrodes of the piezoelectric component shown in FIG. 9.

FIG. 10 shows a first hard mask 50 for forming topside electrodes of the piezoelectric component shown in FIG. 9, and FIG. 11 shows a second hard mask 60. These hard masks 50 and 60 shown are used to produce one discriminator, however, each of the actual hard masks 50 and 60 includes a plurality of openings so as to simultaneously form a plurality of electrodes on a motherboard.

The first hard mask 50 is preferably made of a heat-resistant metallic or resin plate and includes an opening 51 for forming the vibration electrode 41 and an opening 52 for forming the lead electrode 44. In addition, at edges of these openings 51 and 52, tapered extended portions are provided in the same manner as shown in FIGS. 3 and 4.

Also, the second hard mask 60, in the same manner as in the first hard mask 50, is preferably made of a heat-resistant metallic or resin plate, and includes an opening 61 for forming the terminal electrode 43. Also, the back surface of the hard mask 60, i.e., a contact surface for contacting the piezoelectric substrate 40, is provided with a concave portion 62 provided therein to accommodate the vibration electrode 41 and the lead electrode 44. The depth of the concave portion 62 is at least equal to the thickness of the electrodes formed by using the first hard mask 50, and the shape of the concave part 62 accommodates the above-mentioned electrodes 41 and 44.

In addition, at an edge of the opening 61, a tapered extended portion is also provided.

The distance L3 between the opening 61 of the second hard mask 60 and the vibration electrode 41 formed with the first hard mask 50 is preferably at least about three times the thickness t of the piezoelectric substrate 40, such that the following relationship is satisfied.

L3$\geq$3t

Also, according to this preferred embodiment, after forming the vibration electrode 41 and the lead electrode 44 on the piezoelectric substrate 40 with the first hard mask 50, the terminal electrode 43 is formed using the second hard mask 60. During the latter electrode-formation, the lead electrode 44 and the terminal electrode 43 are partially overlapped so as to produce the overlapped portion 44a. Since the overlapped portion 44a is spaced from the vibration electrode 41 by the distance of at least about three times the thickness t of the piezoelectric substrate 40, the vibration caused by the vibration electrodes 41 and 42 is not disrupted by the overlapped portion 44a, and is also not adversely affected by reflection, thereby obtaining a discriminator with outstanding characteristics.

In addition, the configuration of the electrodes on the back major surface of the piezoelectric substrate 40 is preferably substantially the same as that of the electrodes on the top major surface, such that the electrodes on the back major surface may be formed in the same manner by using the hard masks 50 and 60 used for forming the electrodes on the top major surface.

According to the first preferred embodiment shown in FIGS. 1 to 6, the lead electrodes 9 and 11 are provided with the curved portions 9a and 11a provided at intermediate portions thereof so as to produce the overlapped portions in the curved portions, whereas according to the preferred embodiment shown in FIGS. 9 to 11, the lead electrodes 44 and 46 are formed in a substantially straight shape without the curved portion being formed on the lead electrodes. In this case, since the curved portion or changed-width portion is formed in the respective boundaries between the lead electrodes 44 and 46 and the terminal electrodes 43 and 45, by providing an overlapped portion in this curved portion, the shape of the hard-mask opening is greatly simplified, which prevents the hard mask strength from being reduced.

According to the preferred embodiments described above, two hard masks are used as the divided hard masks, however, three or more hard masks may be used.

Also, the order of use of the first hard mask and second hard mask may be reversed. That is, after the terminal electrodes (and the lead electrode) are formed using the second hard mask, the vibration electrode and the lead electrode may be formed using the first hard mask. In this case, the concave portion for accommodating the electrodes may be preferably provided on the back surface of the first hard mask.

While preferred embodiments of the invention have been described above, it is to be understood that variations and modifications will be apparent to those skilled in the art without departing the scope and spirit of the invention. The scope of the invention, therefore, is to be determined solely by the following claims.

What is claimed is:

1. A method for manufacturing piezoelectric components, in which a vibration electrode, terminal electrodes, and lead electrodes for connecting the vibration electrode to the terminal electrodes are formed on a piezoelectric substrate by a thin-film deposition technique, the method comprising the steps of:

preparing a first hard mask having openings corresponding to the vibration electrode and lead electrodes;

preparing a second hard mask having openings corresponding to at least the terminal electrodes;

continuously forming the vibration electrode and lead electrodes by the thin-film deposition technique while arranging the first hard mask on the piezoelectric substrate; and forming at least the terminal electrodes by the thin-film deposition technique while arranging the second hard mask on the piezoelectric substrate; wherein the first and second hard masks are arranged such that the openings of the first and second hard masks are partially overlapped to form an overlapped portion, and the overlapped portion is located at a position on one of the lead electrode and the terminal electrode, the position being spaced from the vibration electrode by at least about three times the thickness of the piezoelectric substrate.

2. A method according to claim 1, wherein a contact surface between the surface of the piezoelectric substrate and the second hard mask includes a concave portion formed therein for accommodating the vibration and lead electrodes formed by the first hard mask.

3. A method according to claim 2, wherein the lead electrode includes a curved portion at an intermediate portion thereof, the openings of the first hard mask extend from the vibration electrode to positions corresponding to the curved portions of the lead electrodes, and the openings of the second hard mask extend from the terminal electrodes to positions corresponding to the curved portions of the lead electrodes.

4. A method according to claim 2, wherein the lead electrode has a substantially straight configuration, the openings of the first hard mask extend from the vibration electrode to positions corresponding to connection portions of the lead electrodes to the terminal electrodes, and the openings of the second hard mask correspond only to the terminal electrodes.

5. A method according to claim 1, wherein a contact surface between the surface of the piezoelectric substrate and the first hard mask includes a concave portion formed for accommodating the terminal and lead electrodes formed by the second hard mask.

6. A method according to claim 5, wherein the lead electrode has a curved portion at an intermediate portion thereof, the openings of the first hard mask extend from the vibration electrode to positions corresponding to the curved portions of the lead electrodes, and the openings of the second hard mask extend from the terminal electrodes to positions corresponding to the curved portions of the lead electrodes.

7. A method according to claim 5, wherein the lead electrode has a substantially straight configuration, the openings of the first hard mask extend from the vibration electrode to positions corresponding to connection portions of the lead electrodes to the terminal electrodes, and the openings of the second hard mask correspond only to the terminal electrodes.

8. A method according to claim 1, wherein the lead electrode includes a curved portion at an intermediate portion thereof, the openings of the first hard mask extend from the vibration electrode to positions corresponding to the curved portions of the lead electrodes, and the openings of the second hard mask extend from the terminal electrodes to positions corresponding to the curved portions of the lead electrodes.

9. A method according to claim 1, wherein the lead electrode has a substantially straight configuration, the openings of the first hard mask extend from the vibration electrode to positions corresponding to connection portions of the lead electrodes to the terminal electrodes, and the openings of the second hard mask correspond only to the terminal electrodes.

10. A method for manufacturing piezoelectric components including a vibration electrode, terminal electrodes, and lead electrodes to connect the vibration electrode to the terminal electrodes provided on a surface of a piezoelectric substrate, the method comprising the steps of:

providing a first hard mask having openings corresponding to the vibration electrode and at least a portion of the lead electrodes;

providing a second hard mask having openings corresponding to at least the terminal electrodes;

placing the first hard mask on the surface of the piezoelectric substrate;

forming the vibration electrode and at least the portion of the lead electrodes on the surface of the piezoelectric substrate;

placing the second hard mask on the surface of the piezoelectric substrate; and forming at least the terminal electrodes on the surface of the piezoelectric substrate; wherein the first and second hard masks are arranged such that the openings of the first and second hard masks are partially overlapped to form an overlapped portion, and the overlapped portion is located at a position on one of the lead electrode and the terminal electrode, the position being spaced from the vibration electrode by at least about three times the thickness of the piezoelectric substrate.

11. A method according to claim 10, wherein the step of forming the vibration electrode and at least the portion of the lead electrodes is performed using a thin-film deposition technique.

12. A method according to claim 11, wherein the lead electrode includes a curved portion at an intermediate portion thereof, the openings of the first hard mask extend from the vibration electrode to positions corresponding to the curved portions of the lead electrodes, and the openings of the second hard mask extend from the terminal electrodes to positions corresponding to the curved portions of the lead electrodes.

13. A method according to claim 11, wherein the lead electrode has a substantially straight configuration, the openings of the first hard mask extend from the vibration electrode to positions corresponding to connection portions of the lead electrodes to the terminal electrodes, and the openings of the second hard mask correspond only to the terminal electrodes.

14. A method according to claim 10, wherein the step of forming at least the terminal electrodes is performed using a thin-film deposition technique.

15. A method according to claim 14, wherein the lead electrode has a curved portion at an intermediate portion thereof, the openings of the first hard mask extend from the vibration electrode to positions corresponding to the curved portions of the lead electrodes, and the openings of the second hard mask extend from the terminal electrodes to positions corresponding to the curved portions of the lead electrodes.

16. A method according to claim 14, wherein the lead electrode has a substantially straight configuration, the openings of the first hard mask extend from the vibration electrode to positions corresponding to connection portions of the lead electrodes to the terminal electrodes, and the openings of the second hard mask correspond only to the terminal electrodes.

17. A method according to claim 10, wherein a contact surface between the surface of the piezoelectric substrate and the second hard mask includes a concave portion formed therein for accommodating the vibration and lead electrodes formed by the first hard mask.

18. A method according to claim 10, wherein a contact surface between the surface of the piezoelectric substrate and the first hard mask includes a concave portion formed therein for accommodating the terminal and lead electrodes formed by the second hard mask.

19. A method according to claim 10, wherein the lead electrode includes a curved portion at an intermediate portion thereof, the openings of the first hard mask extend from the vibration electrode to positions corresponding to the curved portions of the lead electrodes, and the openings of the second hard mask extend from the terminal electrodes to positions corresponding to the curved portions of the lead electrodes.

20. A method according to claim 10, wherein the lead electrode has a substantially straight configuration, the openings of the first hard mask extend from the vibration electrode to positions corresponding to connection portions of the lead electrodes to the terminal electrodes, and the openings of the second hard mask correspond only to the terminal electrodes.

* * * * *